US008742654B2

(12) United States Patent
Cabalu et al.

(10) Patent No.: US 8,742,654 B2
(45) Date of Patent: Jun. 3, 2014

(54) SOLID STATE LIGHT EMITTING DEVICES INCLUDING NONHOMOGENEOUS LUMINOPHORIC PARTICLE SIZE LAYERS

(75) Inventors: Jasper Cabalu, Apex, NC (US); Michael John Bergmann, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 432 days.

(21) Appl. No.: 13/035,520

(22) Filed: Feb. 25, 2011

(65) Prior Publication Data

US 2012/0217865 A1 Aug. 30, 2012

(51) Int. Cl.
*H01J 1/62* (2006.01)
*H01J 63/04* (2006.01)

(52) U.S. Cl.
USPC ........... 313/501; 313/483; 313/498; 313/506; 257/79; 257/98; 257/100

(58) Field of Classification Search
USPC .............. 313/483, 498, 501, 506; 257/79, 98, 257/100
See application file for complete search history.

(56) References Cited

U.S. PATENT DOCUMENTS

| | | | | |
|---|---|---|---|---|
| 6,501,091 | B1 * | 12/2002 | Bawendi et al. | 257/14 |
| 6,960,878 | B2 * | 11/2005 | Sakano et al. | 313/512 |
| 7,342,357 | B2 * | 3/2008 | Sakano et al. | 313/512 |
| 7,750,359 | B2 * | 7/2010 | Narendran et al. | 257/98 |
| 7,834,953 | B2 * | 11/2010 | Park et al. | 349/62 |
| 8,288,936 | B2 * | 10/2012 | Ohta et al. | 313/503 |
| 2003/0080341 | A1 * | 5/2003 | Sakano et al. | 257/79 |
| 2005/0117320 | A1 | 6/2005 | Leu et al. | |
| 2006/0226759 | A1 * | 10/2006 | Masuda et al. | 313/486 |
| 2006/0244358 | A1 * | 11/2006 | Kim et al. | 313/486 |
| 2006/0291226 | A1 | 12/2006 | Daicho et al. | |
| 2007/0228949 | A1 * | 10/2007 | Maruyama et al. | 313/512 |
| 2008/0099727 | A1 * | 5/2008 | Sakano et al. | 252/301.4 H |
| 2008/0231170 | A1 * | 9/2008 | Masato et al. | 313/501 |
| 2009/0014741 | A1 * | 1/2009 | Masuda et al. | 257/98 |
| 2009/0256166 | A1 | 10/2009 | Koike et al. | |
| 2009/0278147 | A1 | 11/2009 | Suzuki | |
| 2010/0013375 | A1 | 1/2010 | Maruyama et al. | |
| 2011/0001151 | A1 | 1/2011 | Le Toquin | |
| 2011/0031523 | A1 | 2/2011 | Ishii et al. | |
| 2011/0068356 | A1 * | 3/2011 | Chiang et al. | 257/98 |
| 2011/0266574 | A1 * | 11/2011 | Liao et al. | 257/98 |

OTHER PUBLICATIONS

International Search Report Corresponding to International Application No. PCT/US2012/025534; Date of Mailing: Jun. 22, 2012; 13 Pages.
Collins et al. "Warm White LEDs Having High Color Rendering Index Values and Related Luminophoric Mediums", U.S. Appl. No. 12/720,390, filed Mar. 9, 2010.
Horiba Scientific "A Guidebook to Particle Size Analysis", Horiba Instruments, Inc., 2010.

\* cited by examiner

*Primary Examiner* — Thomas A Hollweg
(74) *Attorney, Agent, or Firm* — Myers Bigel Sibley & Sajovec, P.A.

(57) ABSTRACT

A light emitting device includes an LED and a layer of luminophoric particles, such as phosphor, that are non-homogeneous in size as a function of distance away from the LED. For example, a first layer of relatively large size phosphor particles may be provided between a second layer of relatively small size phosphor particles and the LED. The large particles can provide high brightness and the small particles can reduce angular color temperature variation in emitted light.

2 Claims, 5 Drawing Sheets

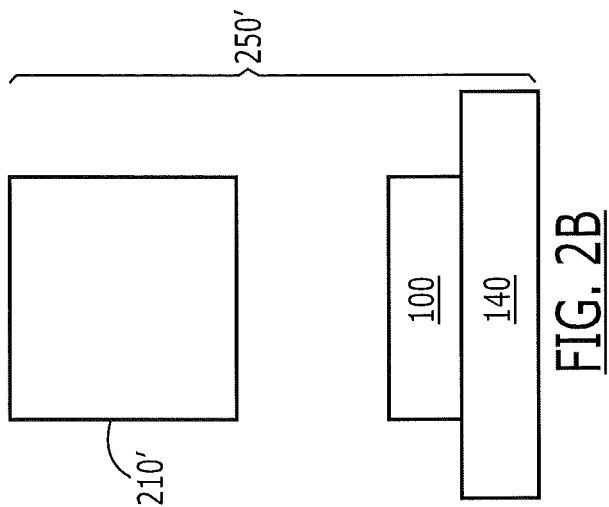
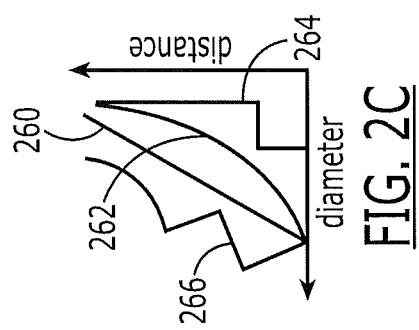
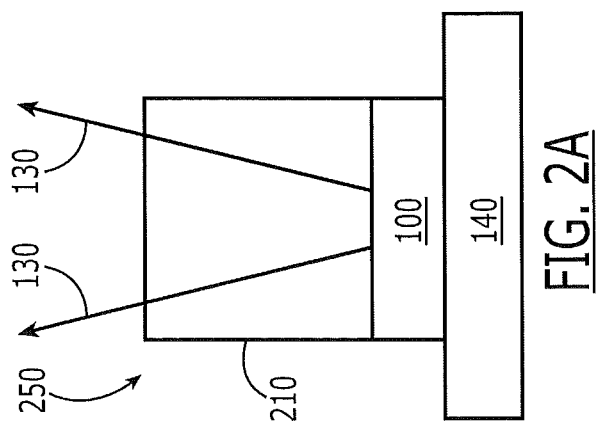

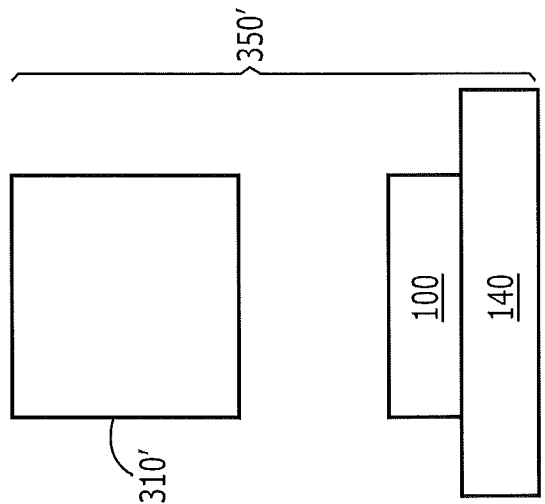
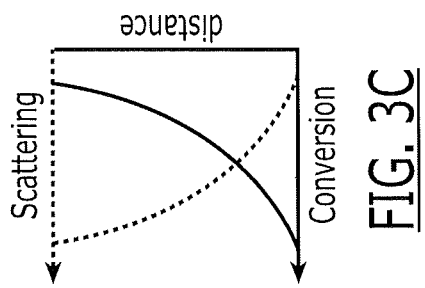
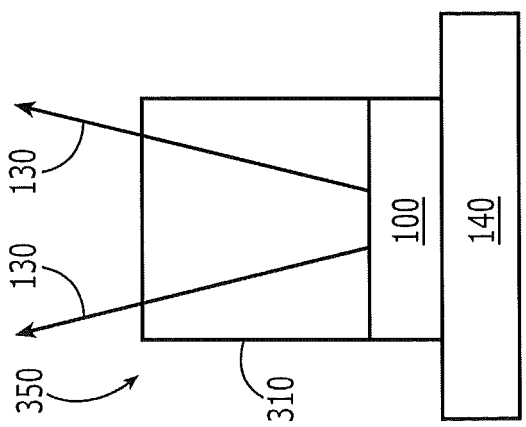

SOLID STATE LIGHT EMITTING DEVICES INCLUDING NONHOMOGENEOUS LUMINOPHORIC PARTICLE SIZE LAYERS

BACKGROUND

Various embodiments described herein relate to light emitting devices and, more particularly, to solid state light emitting devices that include luminophoric layers thereon.

Light emitting diodes ("LEDs") are well known solid state light emitting sources that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. When this occurs, a photon of light is emitted, to generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distributions of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LEDs combine to produce a desired intensity and/or color of white light. For example, by simultaneously energizing red, green and blue light emitting LEDs, the resulting combined light may appear white, or nearly white, depending on the relative intensities of the source red, green and blue LEDs.

White light may also be produced by surrounding a single-color LED with a luminophoric material, such as phosphor, that converts some of the light emitted by the LED to light of other colors by performing wavelength conversion. The combination of the light emitted by the single-color LED that passes through the luminophoric material along with the light of different colors that is emitted by the luminophoric material may produce a white or near-white light. For example, a single blue-emitting LED (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as "YAG:Ce"), that "down-converts" the wavelength of some of the blue light emitted by the LED, changing its color to yellow. Blue LEDs made from indium gallium nitride can exhibit high efficiency (e.g., external quantum efficiency as high as 60%). In a blue LED/yellow phosphor device, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light.

As noted above, phosphors are one known class of luminophoric materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

LEDs are used in a host of applications including, for example, backlighting for liquid crystal displays, indicator lights, automotive headlights, flashlights, specialty lighting applications and as replacements for conventional incandescent and/or fluorescent lighting in general lighting and illumination applications.

SUMMARY OF THE INVENTION

A light emitting device according to various embodiments described herein may include a solid state light emitting source and a layer comprising luminophoric particles that are non-homogeneous in size as a function of distance away from the solid state light emitting source. In some embodiments, the luminophoric particles have non-homogeneous equivalent particle diameter as a function of distance away from the solid state light emitting source.

Light emitting devices according to other embodiments described herein comprise a solid state light emitting source and a layer comprising luminophoric particles having an equivalent particle diameter that decreases with increasing distance away from the solid state light emitting source. The equivalent particle diameter may comprise an average equivalent particle diameter d50, where 50 mass-% of the luminophoric particles has a smaller diameter; an equivalent particle diameter d10, where 10 mass-% of the luminophoric particles has a smaller diameter; and/or an equivalent particle diameter d90, where 90 mass-% of the luminophoric particles has a smaller diameter. Moreover, the equivalent particle diameter may decrease monotonically, non-monotonically, linearly, nonlinearly and/or stepwise with increasing distance away from the solid state light emitting source. The layer may be directly on the solid state light emitting source or spaced apart therefrom.

Light emitting devices according to other embodiments described herein include a solid state light emitting source, a first layer comprising luminophoric particles and a second layer comprising luminophoric particles having an equivalent particle diameter that is smaller than the first layer. The first layer is between the second layer and the solid state light emitting source. The first and second layers may comprise same luminophoric particles having different equivalent particle diameters. The equivalent particle diameter may comprise an average equivalent particle diameter d50, where 50 mass-% of the luminophoric particles has a smaller diameter; an equivalent particle diameter d10, where 10 mass-% of the luminophoric particles has a smaller diameter; and/or an equivalent particle diameter d90, where 90 mass-% of the luminophoric particles has a smaller diameter. For example, in some embodiments, the first layer comprises luminophoric particles having average equivalent particle diameter d50 of at least about 12 μm and the second layer comprises luminophoric particles having average equivalent particle diameter d50 of less than about 8 μm. Moreover, in some embodiments, the first layer is directly on the solid state light emitting source and the second layer is directly on the first layer remote from the solid state light emitting source, whereas in other embodiments, the first and second layers are spaced apart from the solid state light emitting source.

Yet other embodiments described herein provide a light emitting device that comprises a solid state light emitting source and a layer comprising luminophoric particles having light conversion efficiency that decreases with increasing distance away from the solid state light emitting source and having light scattering efficiency that increases with increasing distance away from the solid state light emitting source. In some embodiments, the light conversion efficiency decreases and the light scattering efficiency increases, monotonically, non-monotonically, linearly, nonlinearly and/or stepwise, with increasing distance away from the solid state light emitting source. The layer may be directly on the solid state light emitting source or spaced apart therefrom.

BRIEF DESCRIPTION OF THE DRAWINGS

FIGS. 2A and 2B are cross-sectional views of other light emitting devices according to various embodiments described herein.

FIG. 2C graphically illustrates equivalent particle diameter as a function of distance in the solid state light emitting devices of FIGS. 2A and 2B.

FIGS. 3A and 3B are cross-sectional views of yet other light emitting devices according to various embodiments described herein.

FIG. 3C graphically illustrates conversion efficiency and scattering efficiency as a function of distance for the solid state light emitting devices of FIGS. 3A and 3B.

DETAILED DESCRIPTION

Figure 1A:
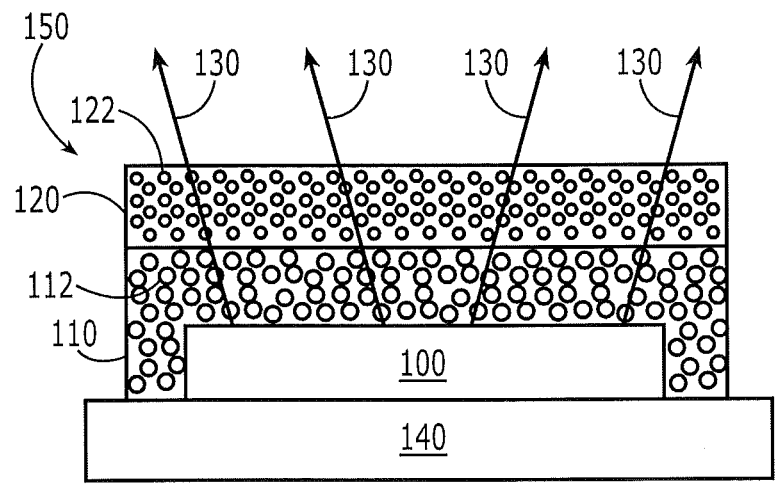
FIGS. 1A-1D are cross-sectional views of light emitting devices according to various embodiments described herein.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein. Moreover, all numerical quantities described herein are approximate and should not be deemed to be exact unless so stated.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Some embodiments described herein can use gallium nitride (GaN)-based LEDs on silicon carbide (SiC)-based substrates. However, it will be understood by those having skill in the art that other embodiments of the present invention may be based on a variety of different combinations of substrate and epitaxial layers. For example, combinations can include AlGaInP LEDs on GaP substrates; InGaAs LEDs on GaAs substrates; AlGaAs LEDs on GaAs substrates; SiC LEDs on SiC or sapphire ($Al_2O_3$) substrates and/or Group III-nitride-based LEDs on gallium nitride, silicon carbide, aluminum nitride, sapphire, zinc oxide and/or other substrates. Moreover, in other embodiments, a substrate may not be present in the finished product. In some embodiments, the LEDs may be gallium nitride-based LED devices manufactured and sold by Cree, Inc. of Durham, N.C., and described generally at cree.com.

Various embodiments described herein may arise from recognition that large-sized luminophoric particles are generally more efficient in light conversion than small-sized luminophoric particles. Unfortunately, due to their large size, large luminophoric particles may also have a lower light scattering efficiency than relatively small luminophoric particles. The low scattering efficiency may produce a high angular variation in Correlated Color Temperature (CCT), which is typical in white LEDs using large particulate size luminophoric particles for brightness boost.

In sharp contrast, various embodiments described herein may provide relatively high brightness with relatively low angular variation, by providing a layer comprising luminophoric particles that are non-homogeneous in size as a function of distance away from the solid state light emitting source. Thus, in some embodiments, the equivalent particle diameter decreases with increasing distance away from the solid state light emitting source. In other embodiments, two or more distinct layers of luminophoric particles may be provided, with the more remote layer(s) having an equivalent particle diameter that is smaller than the adjacent layer(s).

Figure 1B:
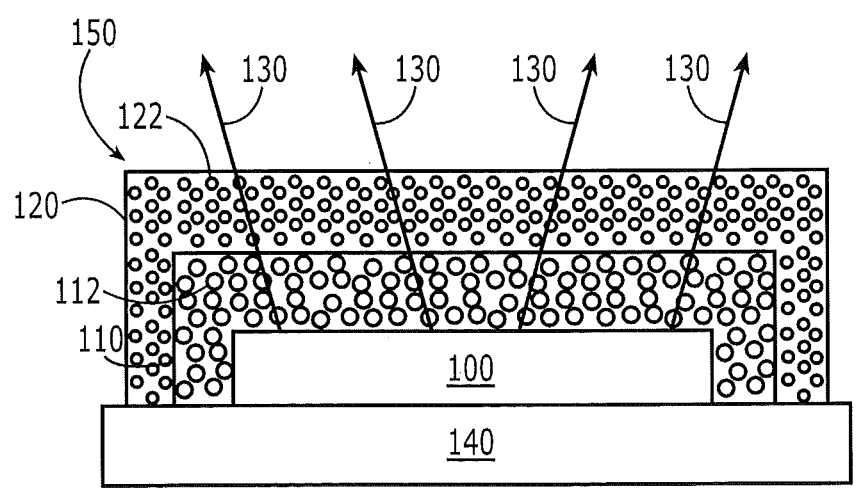

FIGS. 1A and 1B are cross-sectional views of a light emitting device according to various embodiments described herein. Referring now to FIGS. 1A and 1B, the light emitting device 150 includes a solid state light emitting source, such as an LED 100. The LED 100 may be mounted on a mounting substrate 140 that can comprise one or more metals and/or insulators. A first layer 110 comprising luminophoric particles 112 is provided on, and in FIGS. 1A and 1B directly on, the LED 100. A second layer 120 comprising luminophoric particles 122 having an equivalent particle diameter that is smaller than that of the first layer 110, is provided on, and in FIG. 1A directly on, the first layer 110, remote from the LED 100. As such, the first layer 110 is between the second layer 120 and the LED 100, so that light 130 that is emitted from the LED 100 first passes through the first layer 110 and then passes through the second layer 120.

As noted above, the second layer 120 comprises luminophoric particles 122 having an equivalent particle diameter that is smaller than that of the first layer 110, as indicated by the relatively smaller particle size of the luminophoric particles 122 in the second layer 120, compared to the luminophoric particles 112 in the first layer 110. It will be understood, however, that real world luminophoric particle layers are not precisely uniform in size. Rather, consistent with other particulate materials, a range of particle sizes may be provided, and various metrics are used to indicate a measure of particle size in a particulate material. Particle size is generally measured by an equivalent particle diameter, which may take into account the fact that the particles may be non-spherical. Moreover, the particle size distribution may be specified by providing one or more equivalent particle diameters, often abbreviated with "d", to indicate a mass percent of the particles that has a smaller diameter. Thus, d50, also referred to as an average equivalent particle diameter, indicates that 50 mass-% of the particles has a smaller diameter. Moreover, an equivalent particle diameter d10 refers to 10 mass-% of the particles having a smaller diameter, whereas an equivalent particle diameter d90 refers to 90 mass-% of the particles having a smaller diameter. A given luminophoric material may be specified in terms of d50, d10 and/or d90. Moreover, other metrics other than d50, d10 and d90 may be used, such as d75 and d25. Combinations of these metrics also may be used.

Referring again to FIGS. 1A and 1B, the equivalent particle diameter of the luminophoric particles 122 in the second layer 120 is smaller than the equivalent particle diameter of the luminophoric particles 112 in the first layer 110. Thus, in some embodiments, the average equivalent particle diameter d50 of the particles 122 in layer 120 is smaller than the average equivalent particle diameter d50 of the luminophoric particles 112 in the first layer 110. In other embodiments, the d10 of the particles 122 may be less than the d10 of the particles 112 and/or the d90 of the particles 122 may be less than the d90 of particles 112. It will be understood that in all of these embodiments, the luminophoric particles may be the same particles having different equivalent particle diameters. For example, when the LED 100 is a blue LED, the luminophoric particles may be YAG:Ce phosphor particles of different equivalent particle diameters. In other embodiments, the LED 100 may be a violet or ultraviolet emitting LED, and the luminophoric particles may be red emitting phosphor particles, such as CASN-based phosphor having different particle sizes. Combinations of these and other embodiments may be provided.

In one specific embodiment, the LED 100 may be a blue LED having a dominant wavelength of about 445-465 nm, and the phosphor may comprise YAG:Ce having yellow fluorescence with a peak wavelength of about 550 nm, in response to the blue LED emission. The first layer 110 may have an average equivalent particle diameter d50 of at least about 12 µm, and the second layer may have an average equivalent particle diameter d50 of less than about 8 µm. The first layer 110 may be between about 17 µm and 40 µm in thickness, and in some embodiments may be about 20 µm thick. The second layer 120 may be between about 8 µm and about 20 µm in thickness, and in some embodiments may be about 10 µm thick. The first and second layers 110 and 120 may be deposited on the LED 100 including, in some embodiments, on the side surfaces of the LED 100, as illustrated in FIGS. 1A and 1B, using conventional phosphor deposition techniques and/or may be applied as one or more preformed layers. Any conventional phosphor fabrication/application technique may be used.

Figure 1C:
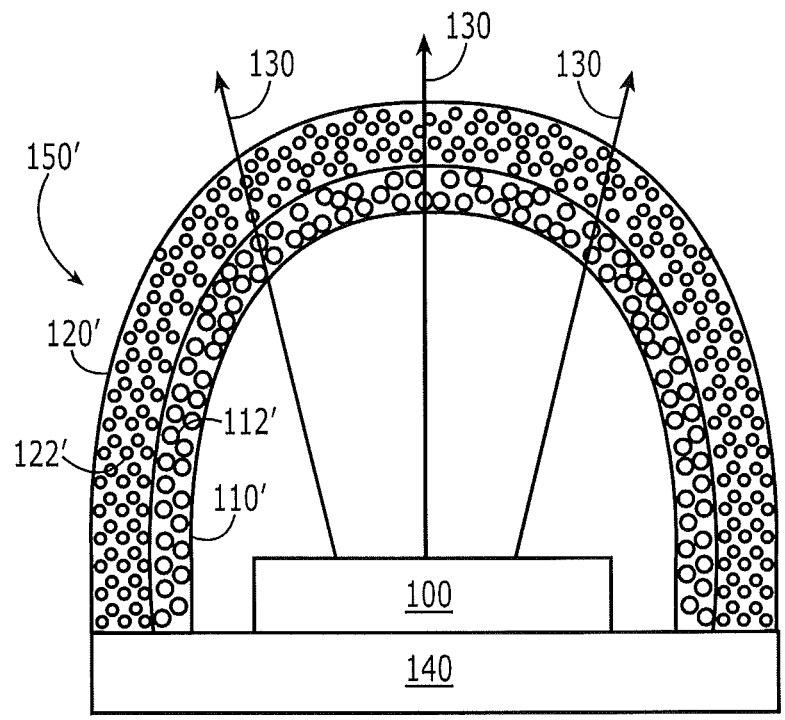
Figure 1D:
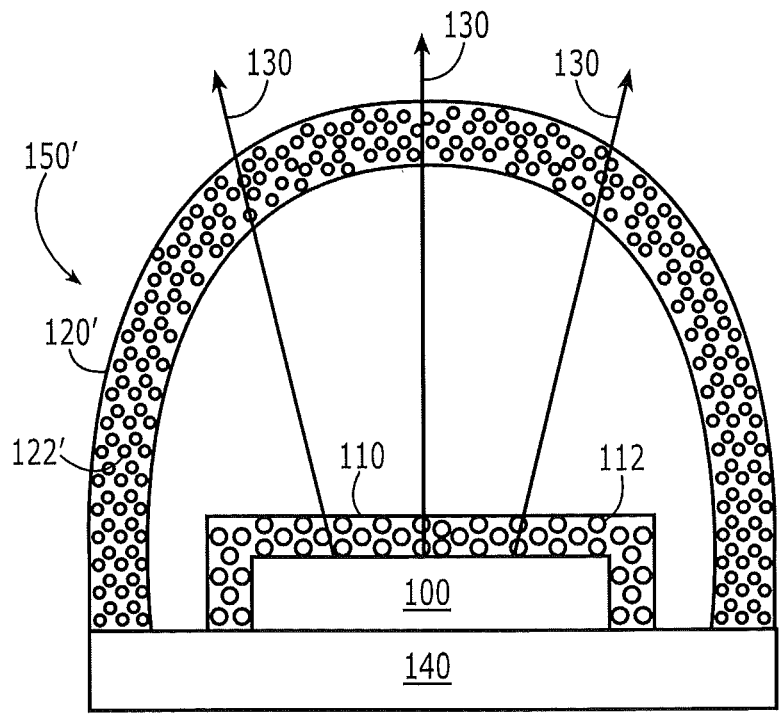

FIG. 1C illustrates other embodiments of a light emitting device 150' wherein the first phosphor layer 110' including the large equivalent particle diameter particles 112', is not directly on the LED 100, but, rather, is remote or spaced apart therefrom. The second layer 120' comprising luminophoric particles 122' having an equivalent particle diameter that is smaller than that of the first layer 110', may be directly on the first layer 110' or may be spaced apart therefrom, as long as the first layer 110' is between second layer 120' and the LED 100, so that light 130 first passes through the first layer 110' and then through the second layer 120'. FIG. 1D illustrates other embodiments of a light emitting device 150' wherein the first phosphor layer 110 including the large equivalent particle diameter particles 112 is directly on the LED 100 and the second layer 120' comprising the smaller equivalent particle diameter particles 122' is spaced apart from the first phosphor layer 110.

Accordingly, various embodiments described herein may be used in "remote phosphor" applications as well. In FIGS. 1C and 1D, the first and second layers 110' and 120' are illustrated in the form of a dome, bulb or other spheroidal section. However, other shapes of the remote phosphor layers may be used. A supporting layer may also be provided to support the remote phosphor in some embodiments, and the remote phosphor layers 110' and 120' need not be directly attached to the mounting substrate 140.

Accordingly, various embodiments as described in FIGS. 1A-1D can increase the brightness of white LEDs by using big particulate-sized phosphors in combination with small particulate-sized phosphors, while reducing or eliminating the problem of high angular variation in CCT, which is typical of white LEDs using large particulate-sized phosphors for brightness boost. This may be achieved in some embodiments of FIGS. 1A-1D by depositing a thin layer 110 of the big particulate-sized phosphor 112 first on top or remote to the LED 100 on a substrate 140 for the brightness gain, and then providing a thin coating 120 of the small particulate-sized phosphor 122 for reduced angular CCT variation. The thin and layered deposition of the phosphor can be provided using conformal coating methods, such as high pressure spray processes and/or any other method that can produce thin material deposition.

White LEDs employing phosphors with big particulate sizes have been shown to be brighter than white LEDs employing phosphors with small particulate sizes. However, white LEDs employing phosphors with big particulate sizes generally suffer a large angular variation of CCT compared to white LEDs employing phosphor with small particulate sizes. This large angular variation of CCT may be due to the lack of blue light scattering inside the phosphor layer. However, using embodiments of FIGS. 1A-1D, and providing a thin layer of big particulate-sized phosphor and followed by a thin layer of the small particulate-sized phosphor, can help increase the overall white LED brightness, while reducing the angular variation of CCT, respectively.

Finally, it will be understood that three or more layers comprising luminophoric particles may be provided according to other embodiments, wherein the equivalent particle diameter decreases in those layers that are more remote from the solid state light emitting surface.

Embodiments of FIGS. 1A-1D utilize two or more discrete layers having different equivalent particle diameters. However, discrete layers need not be provided. Rather, according to embodiments that will now be described in connection with FIGS. 2A-2C, a layer comprising luminophoric particles may be provided, having an equivalent particle diameter that decreases with increasing distance away from the solid state light emitting source.

Thus, referring to FIG. 2A, a light emitting device 250 may include a layer 210 that comprises luminophoric particles having an equivalent particle diameter that decreases with increasing distance away from the solid state light emitting source such as the LED 100. The layer 210 may be directly on the LED 100, as illustrated in FIG. 2A. Alternatively, in light emitting devices 250' of FIG. 2B, a layer 210' comprising luminophoric particles having equivalent particle diameter that decreases with increasing distance away from the LED 100 may be provided remote or spaced apart from the LED 100.

Many different embodiments of a layer 210/210' comprising luminophoric particles having an equivalent particle diameter that decreases with increasing distance away from the LED may be provided, as is graphically illustrated in FIG. 2C. FIG. 2C graphically illustrates the average equivalent particle diameter as a function of distance away from the LED 100. The "distance" axis lines up with the distance in the layer 210/210' from the LED 100. As shown in FIG. 2C, the decrease may be linear, as shown by straight line 260; non-linear, as shown by line 262; and/or stepwise, as shown by line 264. Moreover, lines 260, 262 and 264 illustrate monotonic decreases, whereas line 266 illustrates non-monotonic decreases. It will be understood that the lines 260-266 may depict the equivalent particle diameter d50, d10, d90 and/or other metrics of equivalent particle diameter.

FIGS. 3A-3C illustrate light emitting devices according to other embodiments described herein. In FIG. 3A, a light emitting device 350 includes a solid state light emitting source such as an LED 100 and a layer 310 comprising luminophoric particles having light conversion efficiency that decreases with increasing distance away from the solid state light emitting source 100, and having light scattering efficiency that increases with increasing distance away from the solid state light emitting source. FIG. 3B illustrates a light emitting device 350' wherein the layer 310 comprising luminophoric particles having light conversion efficiency that decreases with increasing distance away from the LED 100 and having light scattering efficiency that increases with increasing distance away from the LED 100, is spaced apart from the light emitting source 100.

FIG. 3C graphically illustrates the inverse relationship between light conversion efficiency (shown in solid line) and light scattering efficiency (shown in dashed line). The "distance" axis lines up with the distance in the layer 310/310' from the LED 100. Light conversion efficiency decreases as a function of distance away from the LED 100, for example, as particle size decreases. In contrast, light scattering efficiency increases as a function of distance away from the LED 100 due to, for example, decreasing particle size. It will be understood that the relationship between conversion efficiency and scattering efficiency need not be exact inverses of one another, and the relationship may be linear, nonlinear, monotonic, non-monotonic and/or stepwise, as was illustrated in FIG. 2C.

It will also be understood that FIGS. 1A-1D may be regarded as specific embodiments of FIGS. 2A/3A and 2B/3B, wherein a stepwise decrease in particle size as shown at 264 of FIG. 2C is provided, and wherein the layers 110 and 120 may be regarded as sublayers of layers 210, 210', 310 and/or 310'.

Various embodiments have been described herein in terms of one or more luminophoric layers having a given type of luminophoric particles that are non-homogeneous in size as a function of distance away from the solid state light emitting source. However, in other embodiments, each of the layers may comprise a mixture of two or more luminophoric particles. In these embodiments, one or more luminophoric particle types in the mixture may be non-homogeneous in size as a function of distance away from the solid state light emitting source. Thus, for example, when the layers 110, 120, 110', 120', 210, 210', 310 or 310' comprise a mixture of two different phosphors, the equivalent particle diameter of only one of the phosphors in the mixture may decrease with increasing distance away from the solid state light emitting source or the equivalent particle diameter of both of the phosphors in the mixture may decrease with decreasing distance away from the solid state light emitting source. Similarly, when a mixture of three phosphors is provided, one, two or all three of the phosphors may have an equivalent particle diameter that decreases with increasing distance away from the solid state light emitting source. Various phosphors and mixtures of phosphors that may be used for light emitting devices are described in detail in U.S. patent application Ser. No. 12/720,390, to Collins et al., filed Mar. 9, 2010 and entitled "Warm White LEDs Having High Color Rendering Index Values and Related Luminophoric Mediums", the disclosure of which is hereby incorporated herein by reference in its entirety as if set forth fully herein.

COMPARATIVE EXAMPLE

The following Example shall be regarded as merely illustrative and shall not be construed as limiting the invention.

Figure 4:
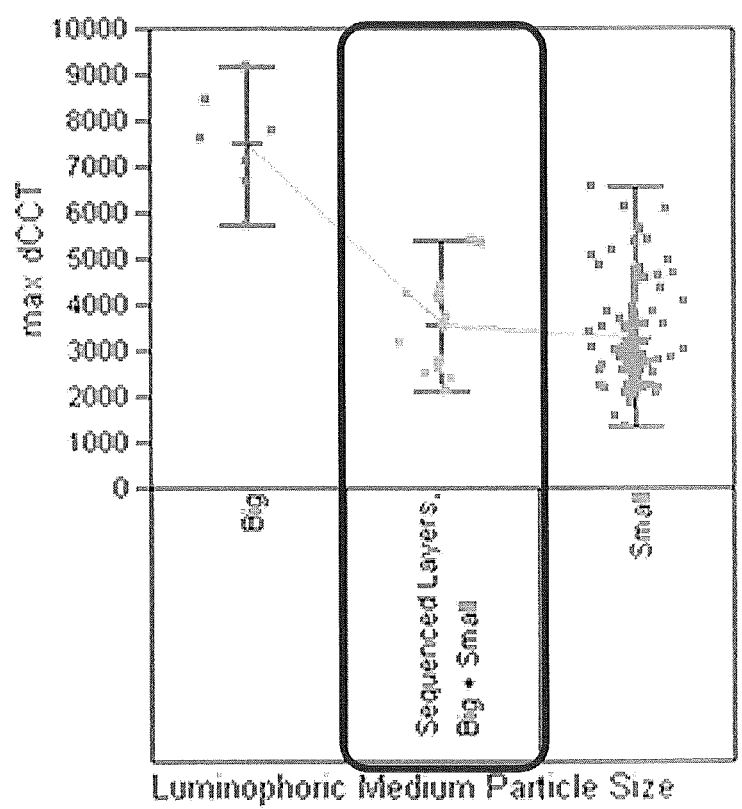
FIG. 4 graphically illustrates angular change or delta in Correlated Color Temperature (dCCT) as a function of luminophoric medium particle size, according to various embodiments described herein.

Specifically, FIG. 4 graphically illustrates maximum dCCT as a function of luminophoric medium particle size. In all embodiments, all luminophoric particles are yellow YAG:Ce particles. The left side of FIG. 4 illustrates "Big" particle size, i.e., phosphor particles with d50=12 μm. The right side illustrates "Small" particle size, i.e., d50=5 μm. The middle of FIG. 4 illustrates "Sequenced Layers, Big+Small" particles, as illustrated in FIG. 1A, with the first phosphor layer 110 being 20 μm of d50=12 μm particles, and the second phosphor layer 120 being 10 μm of d50=5 μm particles.

As shown in FIG. 4, the Big particles have a high max dCCT, whereas the Sequenced Layers, Big+Small particles according to embodiments of FIG. 1A have about the same maximum dCCT as the Small particles alone. Moreover, the presence of the big particles can provide a higher overall light conversion efficiency than the small particles alone and, thus, can produce a brighter white LED.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
a solid state light emitting source; and
a remote layer comprising luminophoric particles having an equivalent particle diameter that decreases with increasing distance away from the solid state light emitting source,
wherein the remote layer is spaced apart from the solid state light emitting source and no other layer comprising luminophoric particles is between the solid state light emitting source and the remote layer, and
wherein the equivalent particle diameter decreases non-monotonically with increasing distance away from the solid state light emitting source.

2. A light emitting device comprising:
a solid state light emitting source; and
a remote layer comprising luminophoric particles having an equivalent particle diameter that decreases with increasing distance away from the solid state light emitting source,
wherein the remote layer is spaced apart from the solid state light emitting source and no other layer comprising luminophoric particles is between the solid state light emitting source and the remote layer, and
wherein the luminophoric particles are a first type of luminophoric particles, the remote layer further comprising a second type of luminophoric particles having an equivalent particle diameter that does not decrease with increasing distance away from the solid state light emitting source.

* * * * *